United States Patent
Lin et al.

(10) Patent No.: US 10,734,972 B1
(45) Date of Patent: Aug. 4, 2020

(54) SWITCH-TYPE PHASE SHIFTER

(71) Applicant: Industrial Technology Research Institute, Hsin-Chu (TW)

(72) Inventors: Yen-Heng Lin, Tainan (TW); Fang-Yao Kuo, Taichung (TW); Zuo-Min Tsai, Miaoli County (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 16/728,109

(22) Filed: Dec. 27, 2019

(30) Foreign Application Priority Data

Nov. 28, 2019 (TW) .............................. 108143339 A

(51) Int. Cl.
*H03H 11/20* (2006.01)
*H03H 7/20* (2006.01)
*H01F 21/00* (2006.01)

(52) U.S. Cl.
CPC ............. *H03H 11/20* (2013.01); *H01F 21/00* (2013.01); *H03H 7/20* (2013.01)

(58) Field of Classification Search
None
See application file for complete search history.

(56) References Cited

U.S. PATENT DOCUMENTS

| 6,396,360 B1 * | 5/2002 | Cai ......................... H03B 5/26 331/108 B |
| 6,407,002 B1 | 6/2002 | Lin et al. |
| 7,239,218 B2 | 7/2007 | Nakamura |
| 7,259,649 B2 | 8/2007 | Ancey et al. |
| 7,495,529 B2 | 2/2009 | Miyaguchi et al. |

(Continued)

FOREIGN PATENT DOCUMENTS

| CN | 101743663 A | 6/2010 |
| CN | 104852706 A | 8/2015 |
| CN | 105552485 | 5/2016 |
| CN | 107332538 A | 11/2017 |
| CN | 109802652 | 5/2019 |
| TW | 200737581 | 10/2007 |

(Continued)

OTHER PUBLICATIONS

W. T. Li, Y. C. Chiang, J. H. Tsai, H. Y. Yanh, J. H. Cheng, T. W. Huang, "60-GHz 5-bit phase shifter with integrated VGA phase-error compensation", IEEE Trans. Microw. Theory Tech., vol. 61, No. 3, pp. 1224-1235, Mar. 2013.

(Continued)

*Primary Examiner* — Cassandra F Cox
(74) *Attorney, Agent, or Firm* — WPAT, PC

(57) ABSTRACT

A switch-type phase shifter including a phase shifting unit is provided. The phase shifting unit includes two half circuits and a first switch connected to the half circuits and receiving a first control signal. Each half circuit includes a first variable capacitor, a second variable capacitor, a second switch and a variable inductor. The two ends of the first variable capacitor are coupled to the input and the control nodes of the half circuit respectively. The two ends of the second variable capacitor are coupled to the output and control nodes of the half circuit respectively. The first and second ends of the second switch are coupled to the output and input nodes respectively, and the third end thereof is coupled to the control node and receives a second control signal. The two ends of the variable inductor are coupled to the input and output nodes respectively.

17 Claims, 15 Drawing Sheets

(56) References Cited

U.S. PATENT DOCUMENTS

| | | | |
|---|---|---|---|
| 7,541,894 B2 | 6/2009 | Miyaguchi et al. | |
| 8,212,632 B2* | 7/2012 | Miya | H03H 11/20 333/139 |
| 8,610,477 B2 | 12/2013 | Koechlin et al. | |
| 8,842,410 B2 | 9/2014 | Chan | |
| 9,319,021 B2 | 4/2016 | Ehyaie et al. | |
| 9,450,557 B2* | 9/2016 | Reiha | H01P 1/184 |
| 9,567,204 B2 | 2/2017 | Hung et al. | |
| 9,567,207 B2 | 2/2017 | Tseng et al. | |
| 10,033,349 B2* | 7/2018 | Gamal El Din | H03H 7/20 |
| 10,566,952 B1* | 2/2020 | Lin | H03H 7/20 |
| 2006/0001507 A1* | 1/2006 | Nakamura | H03H 7/20 333/164 |
| 2007/0126208 A1 | 6/2007 | Freedman | |
| 2007/0241835 A1* | 10/2007 | Horng | H03C 3/403 332/103 |
| 2008/0186108 A1* | 8/2008 | Miya | H03H 11/16 333/139 |
| 2009/0051464 A1* | 2/2009 | Atsumo | H03H 11/16 333/139 |
| 2011/0304409 A1* | 12/2011 | Tamura | H03H 11/20 333/139 |
| 2017/0033761 A1* | 2/2017 | Huang | H03H 11/16 |
| 2019/0013814 A1 | 1/2019 | Thuries et al. | |
| 2019/0199334 A1 | 6/2019 | Chakraborty | |

FOREIGN PATENT DOCUMENTS

| | | |
|---|---|---|
| TW | 201106621 | 2/2011 |
| TW | I669908 B | 8/2019 |
| WO | WO2019113244 A1 | 6/2019 |

OTHER PUBLICATIONS

F. Meng, K. Ma, K. S. Yeo, S. Xu, "A 57-to-64-GHz 0.094-mm 2 5-bit passive phase shifter in 65-nm CMOS", Proc. IEEE Symp. VLSI Circuits, vol. 24, No. 5, pp. 1917-1925, May 2016.

B. Min, G. M. Rebeiz, "Single-ended and differential Ka-band Bi-CMOS phased array front-ends", IEEE J. Solid-State Circuits, vol. 43, No. 10, pp. 2239-2250, Oct. 2008.

D.-W. Kang, J.-G. Kim, B.-W. Min, G. M. Rebeiz, "Single and four-element Ka-band transmit/receive phased-array silicon RFICs with 5-bit amplitude and phase control", IEEE Trans. Microw. Theory Tech., vol. 57, No. 12, pp. 3534-3543, Dec. 2009.

G. S. Shin et al., "Low insertion loss, compact 4-bit phase shifter in 65 nm CMOS for 5G applications," IEEE Microw. Wireless Compon. Lett., vol. 26, No. 1, pp. 37-39, Jan. 2016.

H.-S. Lee and B.-W. Min, "W-band CMOS 4-bit phase shifter for high power and phase compression points," IEEE Trans. Circuits Syst. II, Exp. Briefs, vol. 62, No. 1, pp. 1-5, Jan. 2015.

C. Byeon, C. Park, "A Low-loss Compact 60 GHz Phase Shifter in 65 nm CMOS", Jul. 2017, IEEE Microw. and Wireless Compon. Lett.

S. N. Ali, P. Agarwal, J. Baylon, D. Heo, "Reconfigurable High Efficiency Power Amplifier with Tunable Coupling Coefficient Based Transformer for 5G Applications", IEEE MTT-S IMS, Jun. 4-9, 2017.

Yasushi Itoh, Hiroaki Takagi, "A Dual-Band 90-Degree SiGe HBT Active Phase Shifter Using Band-Pass and Band-Stopsigns", IEEE Proceedings of the 47th European Microwave Conference., pp. 232, 2017.

A. Ocera et al., An Innovative reconfigurable reflection-type phase shifter for dual band WLAN applications, Proceedings of 36th European Microwave Conference, 64-67, Manchester, Sep. 2006.

X. Tang, K. Mouthaan, "Dual-band class III loaded-line phase shifters", Proc. AsiaPacific Microw. Conf., pp. 1731-1734, Dec. 2010—710.

Fanyi Meng et al., "A 57-to-64-GHz 0.094-mm2 5-bit Passive Phase Shifter in 65-nm CMOS", May 31, 2016, IEEE Transactions on Very Large Scale Integration (VLSI) Systems.

Ilker Kalyoncu et al., "A 4-bit SiGe Passive Phase Shifter for X-band Phased Arrays", Mar. 28, 2013, 2013 IEEE Radio and Wireless Symposium.

TW Notice of Allowance dated Apr. 8, 2020.

\* cited by examiner

SWITCH-TYPE PHASE SHIFTER

CROSS REFERENCE TO RELATED APPLICATION

All related applications are incorporated by reference. The present application is based on, and claims priority from, Taiwan Application Serial Number 108143339, filed on Nov. 28, 2019, the disclosure of which is hereby incorporated by reference herein in its entirety.

TECHNICAL FIELD

The technical field generally relates to a phase shifter, in particular to a switch-type shifter.

BACKGROUND

With the advance in science, communications technology is rapidly developed. $5^{th}$ generation mobile networks (hereinafter "5G") can effectively increase data transmission rate, reduce delay, saving more energy, decrease cost and expand system capacity, so the advanced wireless technology has become the major development trend for many countries in the word. 5G is mainly applied in low frequency band (less than 6 GHz) or millimeter wave band, and phased array systems are one of the important technologies of the applications in millimeter wave band.

Phase shifters are one of the important components of a phased array system, so the design of the phase shifters will significantly influence the beam forming ability of the phased array system. The applicable frequency bands of 5G may include 28 GHz, 39 GHz, etc.

The characteristics of a phase shifter can be evaluated via RMS phase error and RMS gain error. In general, a 4-bit phase shifter needs 4 phase shifting units of different angles. 16 different phase statuses can be generated by turning on or off the phase shifting units.

SUMMARY

An embodiment of the disclosure relates to a switch-type phase shifter, which include at least one phase shifting unit, and the phase shifting unit includes two half circuits and a first switch coupled to the half circuits and receiving a first control signal. Each of the half circuits includes a first variable capacitor, a second variable capacitor, a second switch and a variable inductor. The first end of the first variable capacitor is coupled to the input node of the half circuit and the second end of the first variable capacitor is coupled to the control node of the half circuit. The first end of the second variable capacitor is coupled to the output node of the half circuit and the second end of the second variable capacitor is coupled to the control node of the half circuit. The first end of the second switch is coupled to the output node of the half circuit, the second end of the second switch is coupled to the input node of the half circuit, and the third end of the second switch is coupled to the control node of the half circuit and receive a second control signal. The first end of the variable inductor is coupled to the input node of the half circuit and the second end of the variable inductor is coupled to the output end of the half circuit.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The disclosure will become more fully understood from the detailed description given herein below and the accompanying drawings which are given by way of illustration only, and thus are not limitative of the disclosure and wherein.

DETAILED DESCRIPTION

Figure 1:
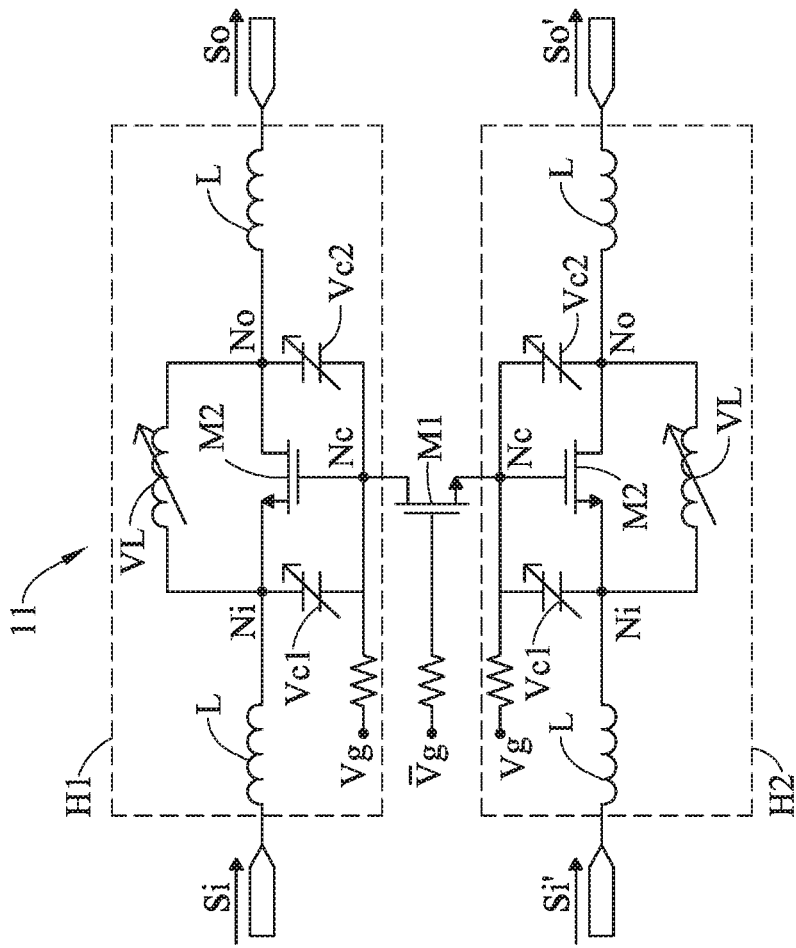
FIG. 1 is a circuit diagram of a phase shifting unit of a switch-type phase shifter of a first embodiment in accordance with the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a circuit diagram of a phase shifting unit of a switch-type phase shifter of a first embodiment in accordance with the disclosure. As shown in FIG. 1, switch-type phase shifter 1 includes at least one phase shifting unit 11.

The phase shifting unit 11 includes two half circuits H1, H2 and a first switch M1. The half circuits H1, H2 are coupled to the first switch M1. The phase shifting unit 11 is a differential circuit. In other words, the amplitude of the input signal Si of the half circuit H1 is equal to the amplitude of the input signal Si' of the half circuit H2; the phase of the input signal Si of the half circuit H1 is opposite to the phase of the input signal Si' of the half circuit H2. In the embodiment, the first switch M1 may be a metal-oxide-semiconductor field-effect transistor (MOSFET). The first end (drain) of the first switch M1 is coupled to the control node Nc of the half circuit H1. The second end (source) of the first switch M1 is coupled to the control node Nc of the half circuit H2. There is a resistor R between the third end (gate) of the first switch M1 and the control signal source, and the third end of the first switch M1 receives a control signal $\overline{V}g$ (first control signal) transmitted from the control signal source. In another embodiment, the first end of the first switch M1 may be the source and the second end of the first switch M1 may be the drain. In another embodiment, the first switch M1 may be a junction gate field-effect transistor (JFET) or other similar elements.

The half circuit H1 includes a first variable capacitor Vc1 and a second variable capacitor Vc2, a second switch M2, a variable inductor VL and two inductors L. In one embodiment, the first variable capacitor Vc1 and the second variable capacitor Vc2 may be metal oxide semiconductor (MOS) capacitors, varactor diodes, or other variable capacitors. In one embodiment, the variable inductor VL may be a path-switched type variable inductor, a transformer-type variable inductor, a MEMS (micro electro mechanical system)-type inductor or other variable inductors.

The first end of the first variable capacitor Vc1 is coupled to the input node Ni of the half circuit H1. The second end of the first variable capacitor Vc1 is coupled to the control node Nc of the half circuit H1.

The first end of the second variable capacitor Vc2 is coupled to the output node No of the half circuit H1. The second end of the second variable capacitor Vc2 is coupled to the control node Nc of the half circuit H1.

In the embodiment, the second switch M2 may be a MOSFET. The first end (drain) of the second switch M2 is coupled to the output node No of the half circuit H1. The second end (source) of the second switch M2 is coupled to the input node Ni of the half circuit H1. The third end (gate) of the second switch M2 is coupled to the control end Nc of the half circuit H1. There is a resistor R between the third end of the second switch M2 and the control signal source, and the third end of the second switch M2 receives a control signal Vg (second control signal) transmitted from the control signal source. In another embodiment, the first end of the second switch M2 may be the source and the second end of the second switch M2 may be the drain.

The first end of the variable inductor VL is coupled to the input node Ni of the half circuit H1, and the second end of the variable inductor VL is coupled to the output node No of the half circuit H1.

The inductors L are coupled to the input node Ni and the output node No of the half circuit H1 respectively, such that the two nodes of the half circuit H1 can achieve impedance matching.

Figure 2:
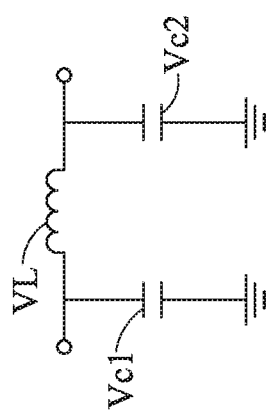
FIG. 2 is a simplified equivalent-circuit diagram of the phase shifting unit of the switch-type phase shifter of the first embodiment in accordance with the disclosure.

FIG. 2 is a simplified equivalent-circuit diagram of the phase shifting unit of the switch-type phase shifter of the first embodiment in accordance with the disclosure (the simplified equivalent-circuit diagram does not include the two inductors L of the circuit shown in FIG. 1). As shown in FIG. 2, the phase term of the transmission coefficient of the half circuit H1 is as shown in Equation (1) given below:

$$|\angle S21| = \Phi \qquad (1)$$

In Equation (1), S21 stands for the transmission coefficient of the half circuit H1; $\Phi$ stands for the target phase difference.

The condition of achieving impedance matching of the input node Ni and the output node No of the half circuit H1 can be expressed by Equation (2) given below:

$$S11 = S22 = 0 \qquad (2)$$

In Equation (2), S11 stands for the reflection coefficient of the input node Ni of the half circuit H1; S22 stands for the reflection coefficient of the output node No of the half circuit H1.

According to Equation (1) and Equation (2), the inductance of the variable inductor VL can be expressed by Equation (3) given below:

$$L = Z_0 \sin|\Phi|/\omega_0 \qquad (3)$$

The capacitances of the first variable capacitor Vc1 and the second variable capacitor Vc2 can be expressed by Equation (4) given below:

$$C1 = C2 = \tan|\Phi/2|/\omega_0 Z_0 \qquad (4)$$

In Equation (3) and Equation (4), L stands for the inductance of the variable inductor VL; C1 stands for the capacitance of the first variable capacitor Vc1; C2 stands for the capacitance of the second variable capacitor Vc2; $Z_0$ stands for the characteristic impedance of the half circuit H1; $\omega_0 = 2\pi f$, where f stands for the operating frequency.

Thus, the characteristics and the phase delay of the phase shifting unit 11 can be changed by adjusting the first variable capacitor Vc1, the second variable capacitor C2 and the variable inductor VL. In this way, the characteristics of the phase shifting unit 11 can satisfy the requirements of several frequency bands and the desired phase delay can be achieved, as shown in Table (1) given below:

|  | 28 GHz | | 39 GHz | |
| --- | --- | --- | --- | --- |
|  | L(pH) | C(fF) | L(pH) | C(fF) |
| 11.25° | 55.4 | 11.2 | 39.8 | 8 |
| 22.5° | 108.8 | 22.6 | 78.1 | 16.2 |

-continued

|  | 28 GHz | | 39 GHz | |
| --- | --- | --- | --- | --- |
|  | L(pH) | C(fF) | L(pH) | C(fF) |
| 45° | 201 | 47.1 | 144.3 | 33.8 |
| 90° | 284.4 | 113.7 | 204 | 81.6 |

Via the above mechanism, the phase shifting unit 11 can achieve the same phase delay even if in different frequency bands, and can be adjusted between two different frequencies. Therefore, the switch-type phase shifter 1 can have great characteristics in the two frequency bands.

Figure 4:
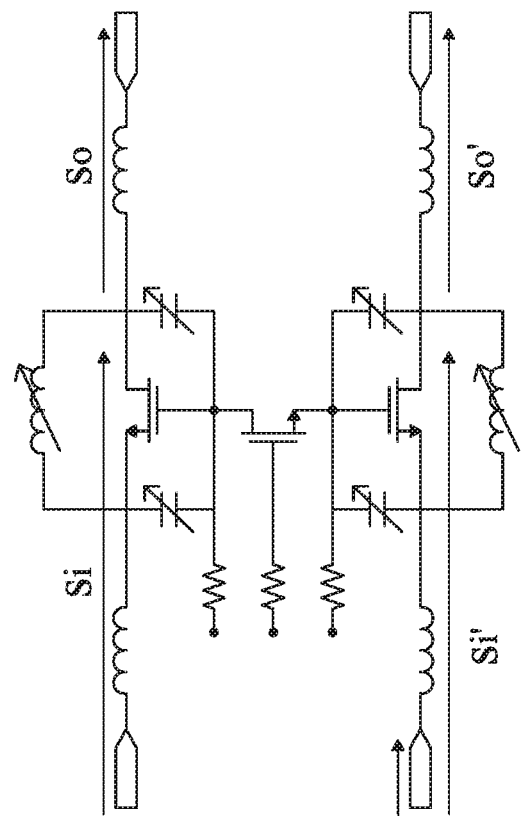
FIG. 3 and FIG. 4 are schematic operational views of the phase shifting unit of the switch-type phase shifter of the first embodiment in accordance with the disclosure.
Figure 3:
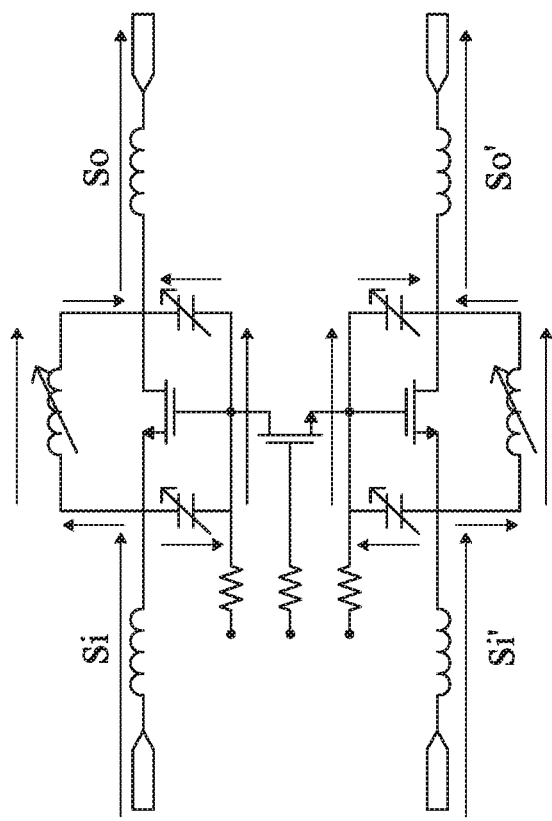

FIG. 3 and FIG. 4 are schematic operational views of the phase shifting unit of the switch-type phase shifter of the first embodiment in accordance with the disclosure. As shown in FIG. 3, when the control signal $\nabla g$ is low level, the control signal Vg is high level; thus, the first switch M1 is off and the second switch M2 is on. As the second switch M2 only has extremely low parasitic resistance, so the input signal Si directly passes through the second switch M2 to generate the output signal So. Currently, the phase shifting unit 11 is in the reference status.

As shown in FIG. 4, when the control signal $\nabla g$ is high level, the control signal Vg is low level; thus, the first switch M1 is on and the second switch M2 is off. Currently, the control node Nc of the half circuit H1 can be considered virtually grounded, and the input signal Si passes through the first variable capacitor Vc1, the second variable capacitor Vc2 and the variable inductor VL to generate the output signal So. At this moment, the phase shifting unit 11 is in the status capable of providing the phase delay function; the simplified equivalent-circuit diagram thereof is shown in FIG. 2. The functions of the elements of the half circuit H2 and the cooperation relations thereof are similar to those of the half circuit H1, so will not be described therein again. Besides, the phase shifting unit 11 is a dual-direction element, so the input node Ni and the output node No of the half circuit H1 (or the half circuit H2) in the embodiment (and the following embodiments) only mean that the two nodes are different nodes instead of the direction of inputting and outputting the signal.

As described above, the phase delay function of the phase shifting unit 11 can be turned on or off by the control signal $\nabla g$ and the control signal Vg. In addition, the characteristics and the phase delay, in different frequency bands, of the phase shifting unit 11 can be changed by adjusting the first variable capacitor Vc1, the second variable capacitor Vc2 and the variable inductor VL. In this way, the characteristics of the phase shifting unit 11 can satisfy the requirements of several frequency bands and the desired phase delay can be achieved.

The embodiment just exemplifies the disclosure and is not intended to limit the scope of the disclosure. Any equivalent modification and variation according to the spirit of the disclosure is to be also included within the scope of the following claims and their equivalents.

Figure 5:
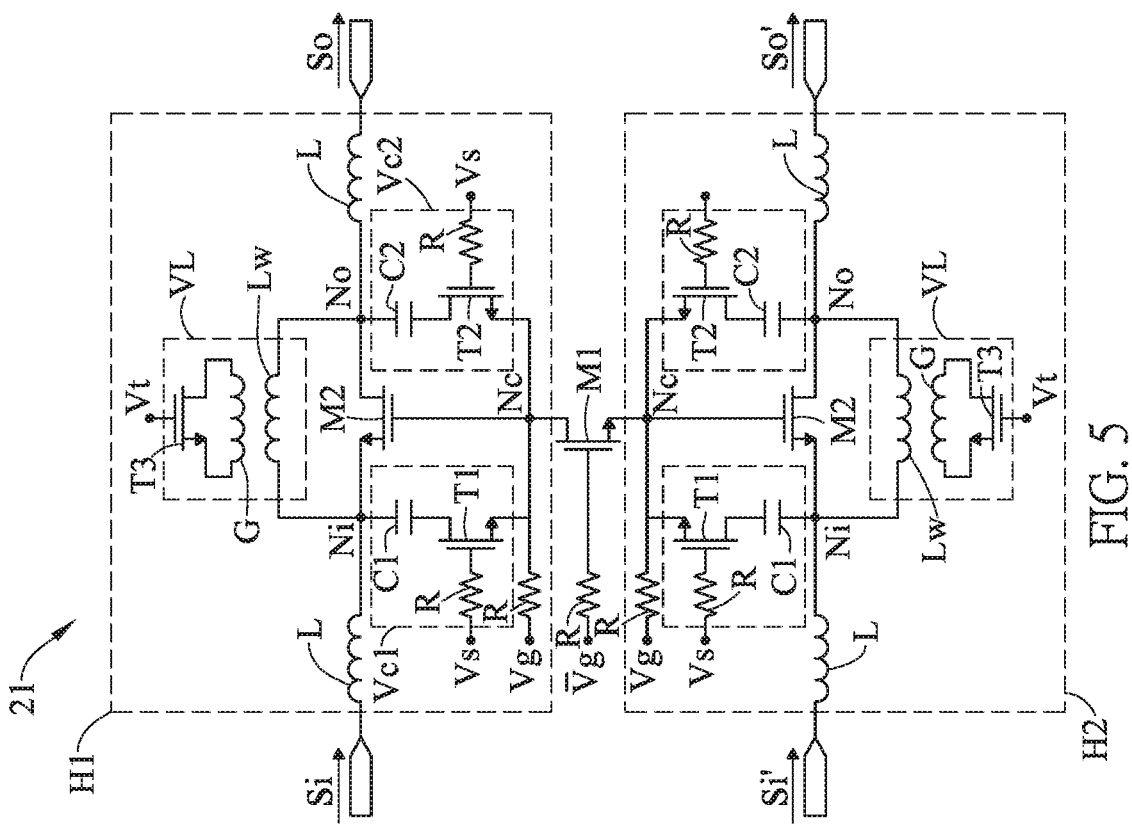
FIG. 5 is a circuit diagram of a phase shifting unit of a switch-type phase shifter of a second embodiment in accordance with the disclosure.

FIG. 5 is a circuit diagram of a phase shifting unit of a switch-type phase shifter of a second embodiment in accordance with the disclosure. As shown in FIG. 5, the switch-type phase shifter 2 includes at least one phase shifting unit 21.

The phase shifting unit 21 includes two half circuits H1, H2 and a first switch M1. The half circuits H1, H2 are coupled to the first switch M1. Similarly, the phase shifting unit 21 is a differential circuit. In other words, the amplitude of the input signal Si of the half circuit H1 is equal to the amplitude of the input signal Si' of the half circuit H2; the phase of the input signal Si of the half circuit H1 is opposite to the phase of the input signal Si' of the half circuit H2. The first switch M1 is a MOSFET. In the embodiment, the drain of the first switch M1 is coupled to the control node Nc of the half circuit H1. The source of the first switch M1 is coupled to the control node Nc of the half circuit H2. There is a resistor R between the gate of the first switch M1 and the control signal source, and the gate of the first switch M1 receives a control signal $\nabla g$ (first control signal) transmitted from the control signal source. In another embodiment, the source of the first switch M1 may be coupled to the control node Nc of the half circuit H1 and the drain of the first switch M1 may be coupled to the control node Nc of the half circuit H2. Similarly, there is a resistor R between the gate of the first switch M1 and the control signal source, and the gate of the first switch M1 receives the control signal transmitted from the control signal source.

The half circuit H1 includes a first variable capacitor Vc1 and a second variable capacitor Vc2, a second switch M2, a variable inductor VL.

The first variable capacitor Vc1 includes a first capacitor C1, a first transistor T1 and a resistor R. In the embodiment, the first transistor T1 may be a MOSFET. In another embodiment, the first transistor T1 may be a JFET or other similar elements The first end of the first capacitor C1 is coupled to the input node Ni of the half circuit H1 and the second end of the first capacitor C1 is coupled to the drain of the first transistor T1, such that the first capacitor C1 and the first transistor T1 can be connected in series. The source of the first transistor T1 is coupled to the control node Nc of the half circuit H1. The resistor R is disposed between the gate of the first transistor T1 and the capacitor control signal source; the gate of the first transistor T1 receives the capacitor control signal Vs transmitted from the capacitor control signal source.

The second variable capacitor Vc2 includes a second capacitor C2, a second transistor T2 and a resistor R. In the embodiment, the second transistor T2 may be a MOSFET. In another embodiment, the second transistor T2 may be a JFET or other similar elements. The first end of the second capacitor C2 is coupled to the output node No of the half circuit H1 and the second end of the second capacitor C2 is coupled to the drain of the second transistor T2, such that the second capacitor C2 and the second transistor T2 can be connected in series. The source of the second transistor T2 is coupled to the control node Nc of the half circuit H1. The resistor R is disposed between the gate of the second transistor T2 and the capacitor control signal source; the gate of the second transistor T2 receives the capacitor control signal Vs transmitted from the capacitor control signal source.

Figure 6:
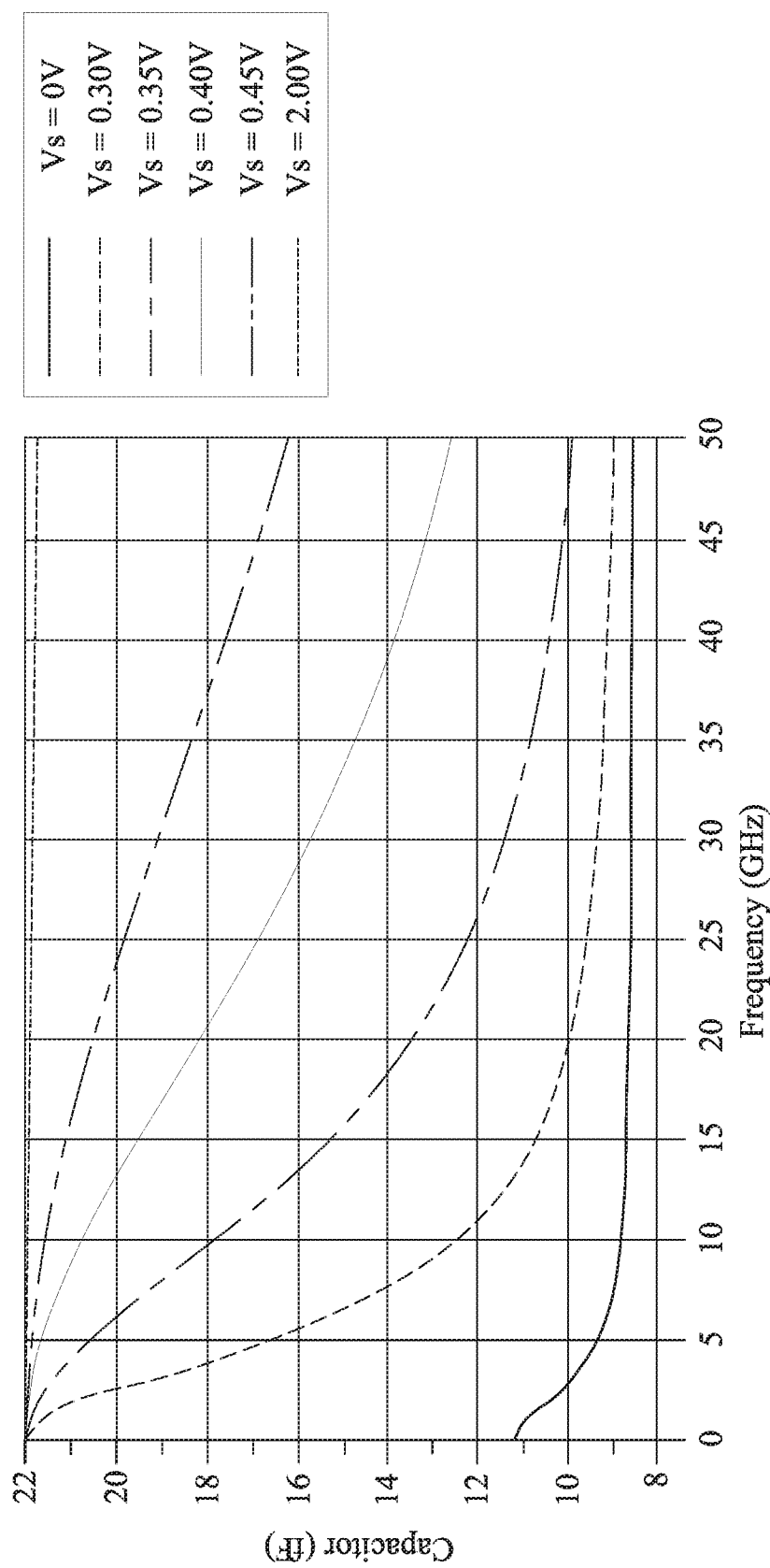
FIG. 6 is a simulation result diagram of a variable capacitor of the switch-type phase shifter of the second embodiment in accordance with the disclosure.

FIG. 6 is a simulation result diagram of a variable capacitor of the switch-type phase shifter of the second embodiment in accordance with the disclosure. The capacitor control signal Vs can turn on or off the first transistor T1 to adjust the equivalent capacitance of the first transistor T1 and the first capacitor C1 in order to adjust the capacitance of the first variable capacitor Vc1. As shown in FIG. 6, the horizontal axis stands for frequency and the vertical axis stands for capacitance. The capacitance of the first capacitor C1 is 22 fF and the total width of the first transistor T1 is 24 μm. FIG. 6 shows the capacitances, in difference frequencies, of the first variable capacitor Vc1 when the first variable capacitor Vc1 is controlled by different capacitor control signals Vs. The second variable capacitor Vc2 can also be adjusted by the same mechanism.

As shown in FIG. 5, in the embodiment, the second switch M2 may be a MOSFET. The drain of the second switch M2 is coupled to the output node No of the half circuit H1. The source of the second switch M2 is coupled to the input node Ni of the half circuit H1. The gate of the second switch M2 is coupled to the control end Nc of the half circuit H1. There is a resistor R between the gate of the second switch M2 and the control signal source, and the gate of the second switch M2 receives a control signal Vg (second control signal) transmitted from the control signal source. In another embodiment, the source of the second switch M2 is coupled to the output node No of the half circuit H1, the drain of the second switch M2 is coupled to the Ni of the half circuit H1, and the gate of the second switch M2 is coupled to the control node Nc of the half circuit H1. Similarly, the gate of the second transistor T2 receives the capacitor control signal Vs transmitted from the capacitor control signal source.

The inductors L are coupled to the input node Ni and the output node No of the half circuit H1 respectively, such that the two nodes of the half circuit H1 can achieve impedance matching.

The variable inductor VL includes a wire wound inductor Lw, a third transistor T3 and a metal grid structure G. The third transistor T3 is coupled to the metal grid structure G and the wire wound inductor Lw is disposed on the metal grid structure.

Figure 7A:
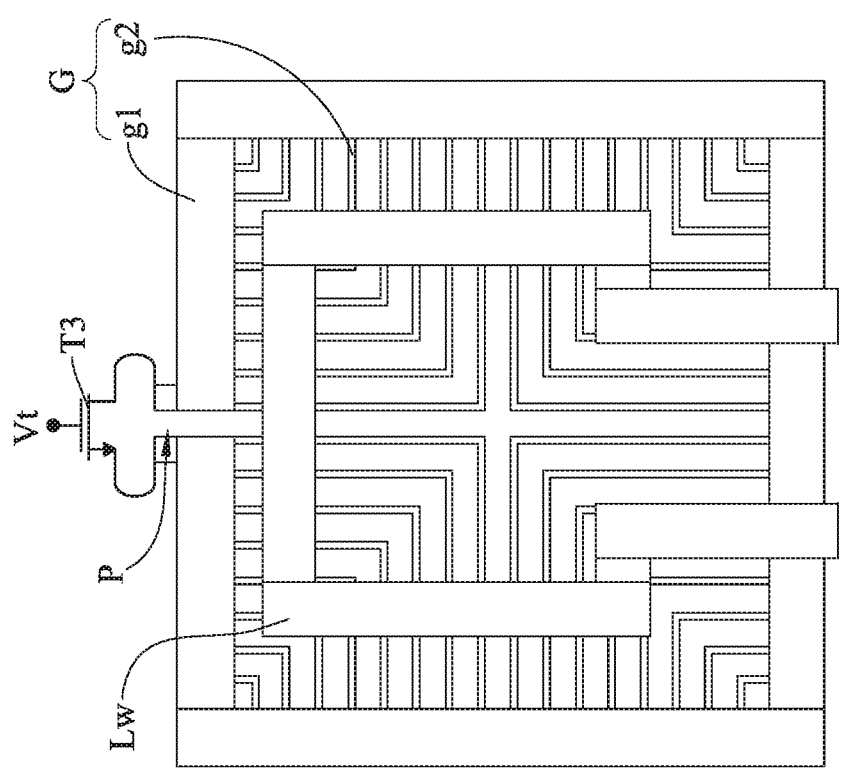
FIG. 7A is a top view of a variable inductor of the switch-type phase shifter of the second embodiment in accordance with the disclosure.
Figure 7B:
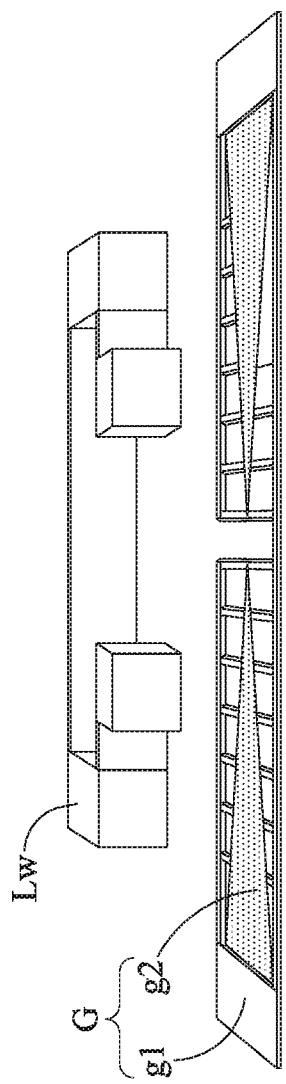
FIG. 7B is a side view of the variable inductor of the switch-type phase shifter of the second embodiment in accordance with the disclosure.
Figure 7C:
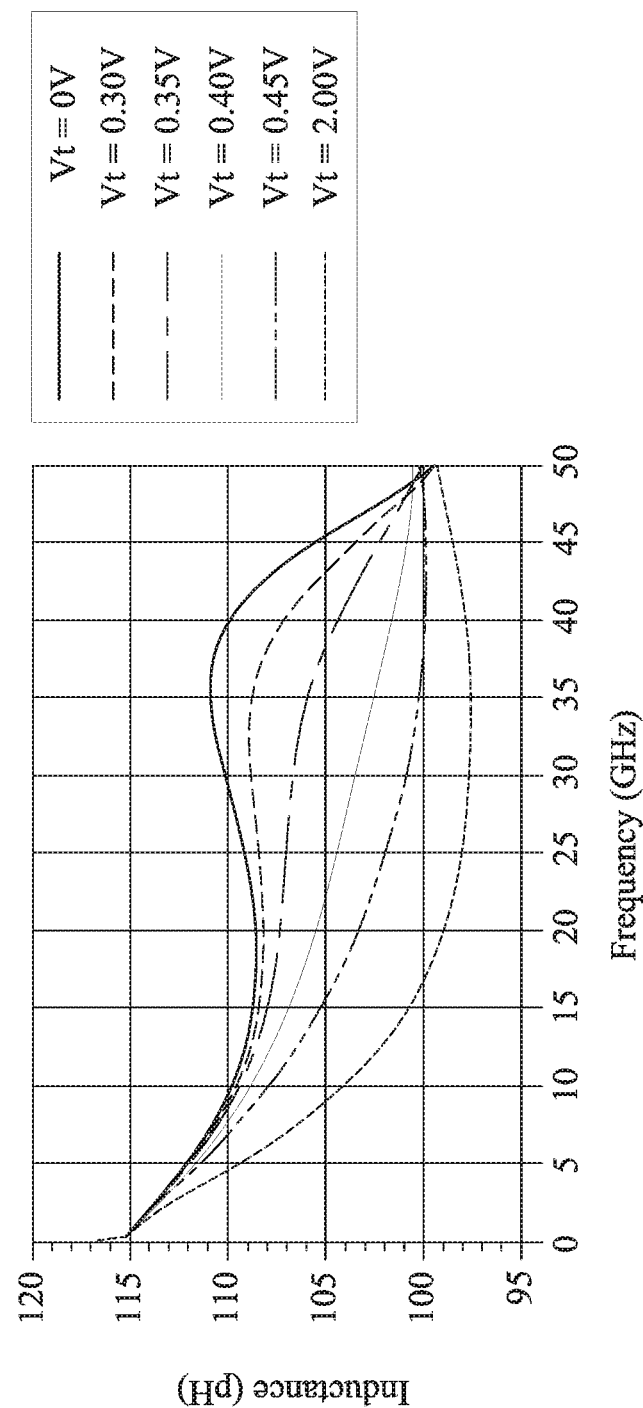
FIG. 7C is a simulation result diagram of a variable inductor of the switch-type phase shifter of the second embodiment in accordance with the disclosure.

FIG. 7A, FIG. 7B and FIG. 7C are a top view, a side view and a simulation result diagram of a variable inductor of the switch-type phase shifter of the second embodiment in accordance with the disclosure respectively. As shown in FIG. 7A, the metal grid structure G includes a frame g1 and a grid structure g2, and the grid structure g2 is disposed in the frame g1. The frame g1 includes an opening P. The source of the third transistor T3 is coupled to one end, adjacent to the opening P, of the frame g1 and the drain of the third transistor T3 is coupled to the other end, adjacent to the opening P, of the frame g1; the gate of the third transistor T3 receives the inductor control signal Vt transmitted from an inductor control signal source.

As shown in FIG. 7B, there is a space between the wire wound inductor Lw and the metal grid structure G. As shown in FIG. 5, the first end of the wire wound inductor Lw is coupled to the input node Ni of the half circuit H1 and the second end of the wire wound inductor Lw is coupled to the output node No of the half circuit H1.

Via the above design, the third transistor T3 can be turned on or off by the inductor control signal Vt to make the third transistor T3 and the metal grid structure G form an open circuit or a close circuit. According to the Lenz law, when the third transistor T3 and the metal grid structure G form a close circuit, a magnetic field is generated due to the signals passing through the wire wound inductor Lw. Then, the metal grid structure G generates eddy currents due to the change of the magnetic flux thereof, which also generate another magnetic field to resist the above change of the magnetic flux. Thus, the equivalent inductance of the variable inductor VL can be changed under the interaction between different magnetic fields. As shown in FIG. 7C, the horizontal axis stands for frequency and the vertical axis stands for inductance. The width of the wire wound inductor Lw is about 8 μm and the length of the wire wound inductor Lw is about 240 μm. FIG. 7C shows the inductances, in difference frequencies, of the variable inductor VL when the variable inductor VL is controlled by different inductor control signals Vt. The elements of the half circuit H2 and the cooperation relations thereof are similar to those of the half circuit H1, so will not be described herein again.

Figure 9:
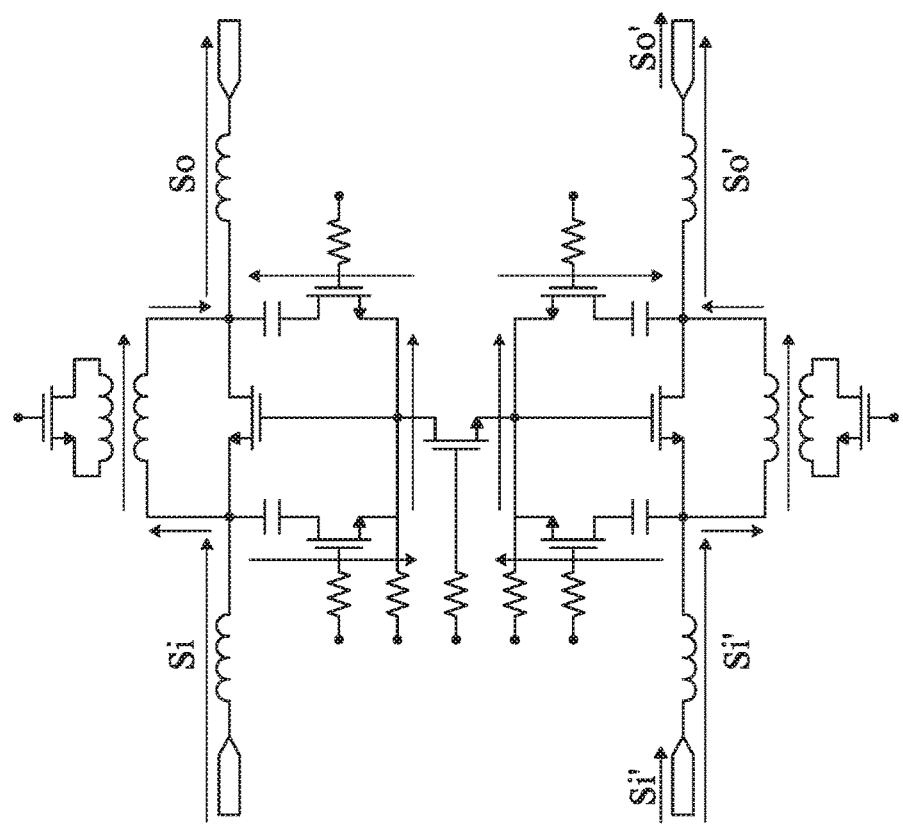
FIG. 8 and FIG. 9 are schematic operational views of the phase shifting unit of the switch-type phase shifter of the second embodiment in accordance with the disclosure.
Figure 8:
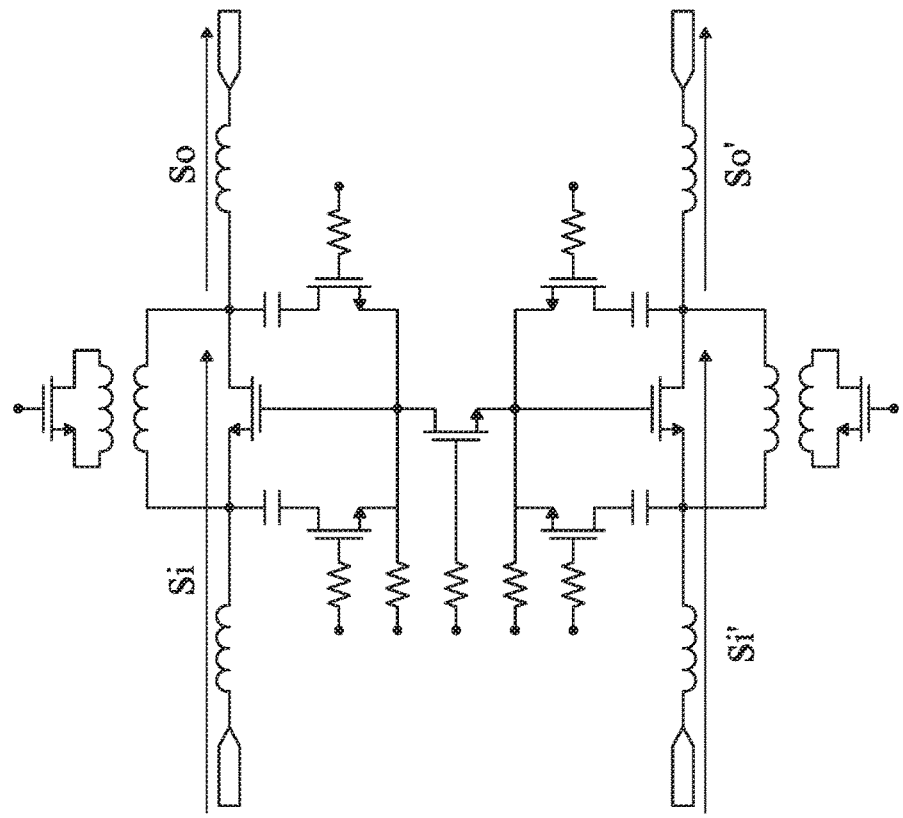

FIG. 8 and FIG. 9 are schematic operational views of the phase shifting unit of the switch-type phase shifter of the second embodiment in accordance with the disclosure. As shown in FIG. 8, when the control signal $\overline{V}g$ is low level, the control signal Vg is high level; thus, the first switch M1 is off and the second switch M2 is on. As the second switch M2 only has extremely low parasitic resistance, so the input signal Si directly passes through the second switch M2 to generate the output signal So. Currently, the phase shifting unit 11 is in the reference status.

As shown in FIG. 9, when the control signal $\overline{V}g$ is high level, the control signal Vg is low level; thus, the first switch M1 is on and the second switch M2 is off. Currently, the control node Nc of the half circuit H1 can be considered virtually grounded, and the input signal Si passes through the first variable capacitor Vc1, the second variable capacitor Vc2 and the variable inductor VL to generate the output signal So. At this moment, the phase shifting unit 21 is in the status capable of providing the phase delay function. The elements of the half circuit H2 and the cooperation relations thereof are similar to those of the half circuit H1, so will not be described herein again.

As described above, the phase delay function of the phase shifting unit 21 can be turned on or off by the control signal $\overline{V}g$ and the control signal Vg. In addition, the characteristics and the phase delay, in different frequency bands, of the phase shifting unit 21 can be changed by adjusting the capacitor control signal Vs and the inductor control signal Vt. In this way, the characteristics of the phase shifting unit 21 can satisfy the requirements of several frequency bands and the desired phase delay can be achieved, so the switch-type phase shifter 2 can have great characteristics in several frequency bands.

The embodiment just exemplifies the disclosure and is not intended to limit the scope of the disclosure. Any equivalent modification and variation according to the spirit of the disclosure is to be also included within the scope of the following claims and their equivalents.

Figure 10B:
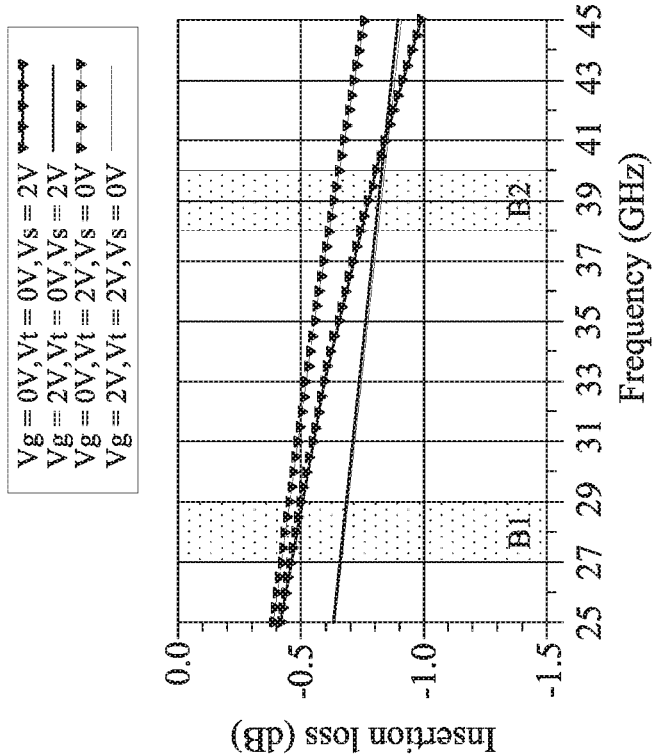
FIG. 10B is a simulation result diagram of insertion loss of the switch-type phase shifter (phase delay=11.250) of the second embodiment in accordance with the disclosure.
Figure 10A:
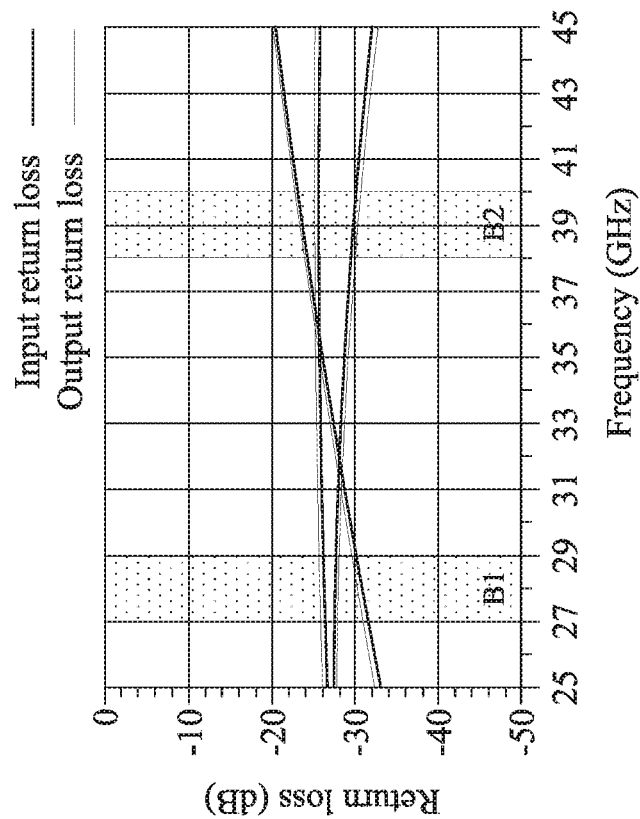
FIG. 10A is a simulation result diagram of return loss of the switch-type phase shifter (phase delay=11.250) of the second embodiment in accordance with the disclosure.
Figure 10C:
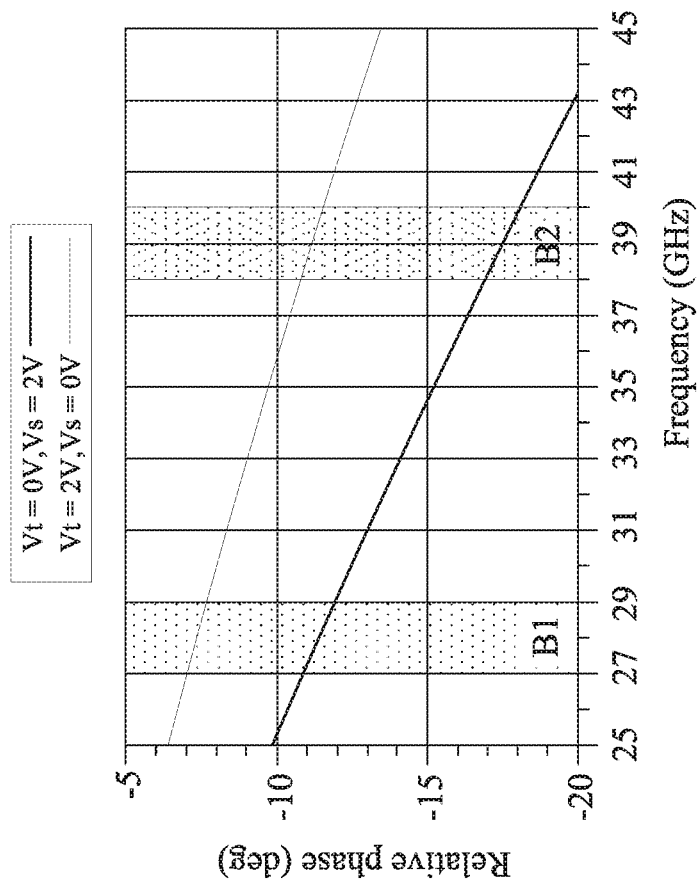
FIG. 10C is a simulation result diagram of relative phase of the switch-type phase shifter (phase delay=11.25) of the second embodiment in accordance with the disclosure.

FIG. 10A, FIG. 10B and FIG. 10C are simulation result diagrams of return loss, insertion loss and relative phase of the switch-type phase shifter (phase delay=11.25°) of the second embodiment in accordance with the disclosure respectively. FIG. 10A shows the input return loss and the output return loss, of each status in different frequency bands, of the switch-type phase shifter 2 when the phase delay of the switch-type phase shifter 2 is 11.25°. The horizontal axis stands for frequency and the vertical axis stands for return loss. As shown in FIG. 10A, the return loss of the switch-type phase shifter 2 is less than −20 dB in both the first frequency band B1 (27-29 GHz) and the second frequency band B2 (38-40 GHz).

FIG. 10B shows the insertion loss, in different frequency bands, of the switch-type phase shifter 2 when the phase delay of the switch-type phase shifter 2 is 11.25°. The horizontal axis stands for frequency and the vertical axis stands for insertion loss. When Vt=0 and Vs=2, the switch-type phase shifter 2 is operated in the first frequency band B1(27-29 GHz). When Vt=2 and Vs=0, the switch-type phase shifter 2 is operated in the second frequency band B2 (38-40 GHz). As shown in FIG. 10B, the loss variation of the switch-type phase shifter 2 is less than 0.5 dB in both the first frequency band B1 (27-29 GHz) and the second frequency band B2 (38-40 GHz).

FIG. 10C shows the relative phase, in different frequency bands, of the switch-type phase shifter 2 when the phase delay of the switch-type phase shifter 2 is 11.250. The horizontal axis stands for frequency and the vertical axis stands for relative phase. When Vt=0 and Vs=2, the switch-type phase shifter 2 is operated in the first frequency band B1 (27-29 GHz). When Vt=2 and Vs=0, the switch-type phase shifter 2 is operated in the second frequency band B2 (38-40 GHz). As shown in FIG. 10C, the relative phase of the switch-type phase shifter 2 is very close to 11.250 in both the first frequency band B1 (27-29 GHz) and the second frequency band B2 (38-40 GHz), so the phase error of the switch-type phase shifter 2 can be significantly reduced.

Figure 11A:
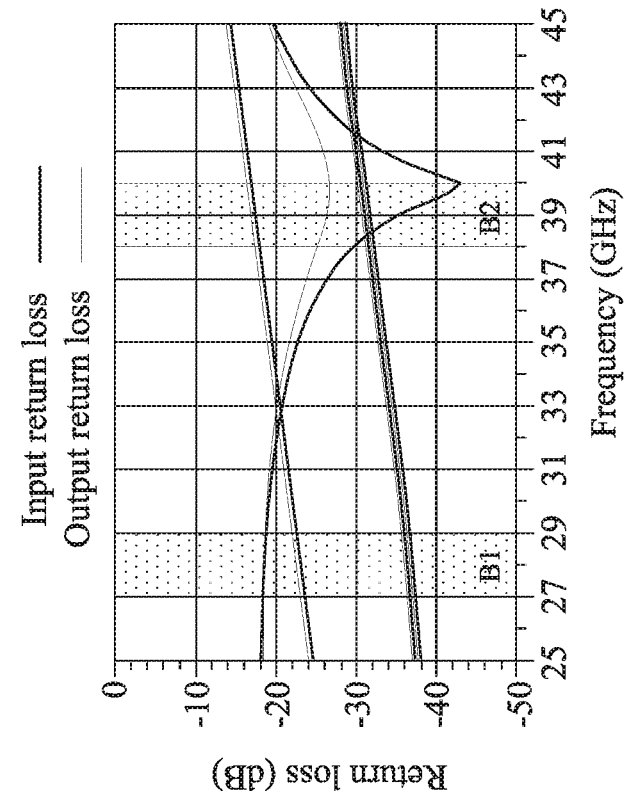
FIG. 11A is a simulation result diagram of return loss of the switch-type phase shifter (phase delay=450) of the second embodiment in accordance with the disclosure.
Figure 11C:
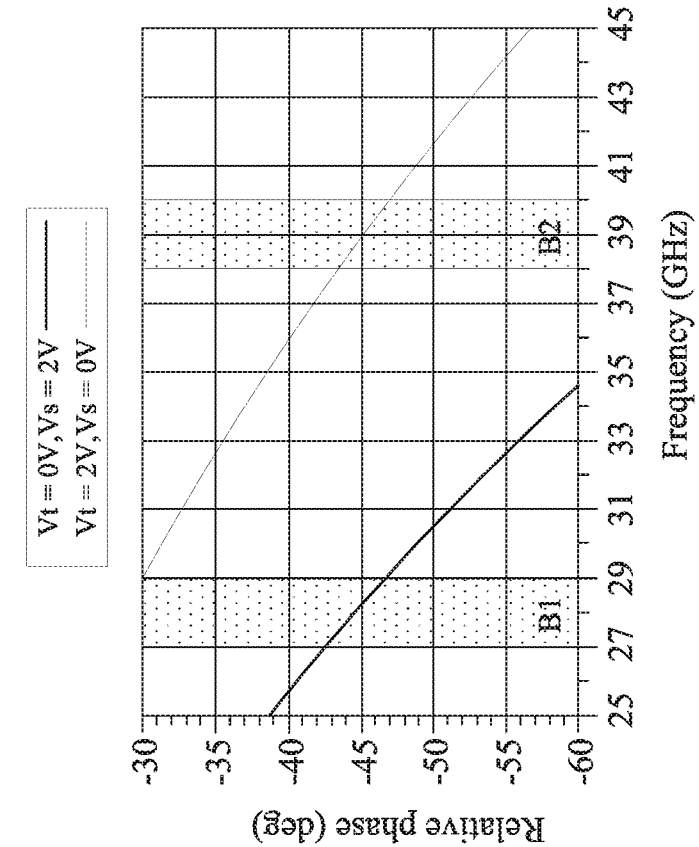
FIG. 11C is a simulation result diagram of relative phase of the switch-type phase shifter (phase delay=45°) of the second embodiment in accordance with the disclosure.
Figure 11B:
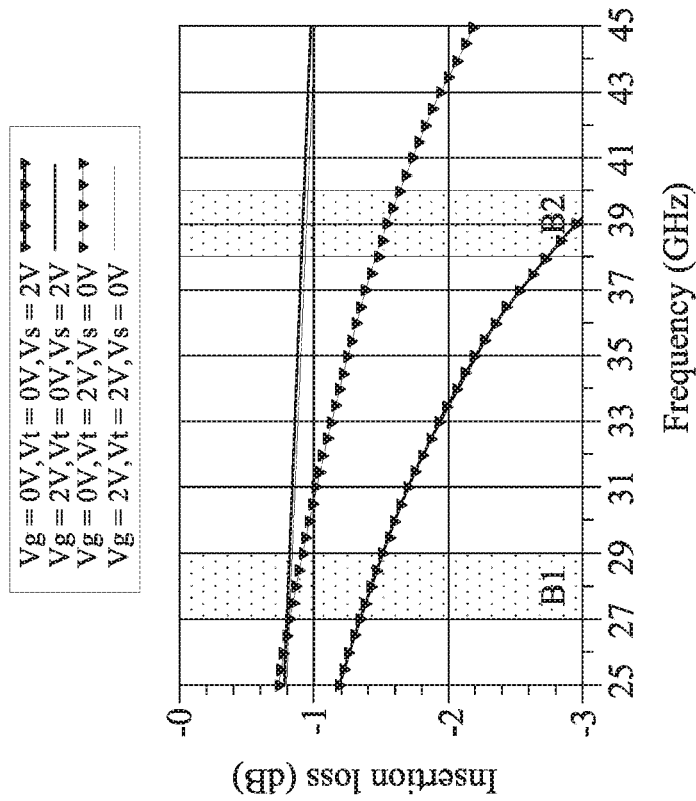
FIG. 11B is a simulation result diagram of insertion loss of the switch-type phase shifter (phase delay=45°) of the second embodiment in accordance with the disclosure.

FIG. 11A, FIG. 11B and FIG. 11C are simulation result diagrams of return loss, insertion loss and relative phase of the switch-type phase shifter (phase delay=45°) of the second embodiment in accordance with the disclosure respectively. FIG. 11A shows the input return loss and the output return loss, of each status in different frequency bands, of the switch-type phase shifter 2 when the phase delay of the switch-type phase shifter 2 is 45°. The horizontal axis stands for frequency and the vertical axis stands for return loss. As shown in FIG. 11A, the return loss of the switch-type phase shifter 2 is less than −15 dB in both the first frequency band B1 (27-29 GHz) and the second frequency band B2 (38-40 GHz).

FIG. 11B shows the insertion loss, in different frequency bands, of the switch-type phase shifter 2 when the phase delay of the switch-type phase shifter 2 is 45°. The horizontal axis stands for frequency and the vertical axis stands for insertion loss. When Vt=0 and Vs=2, the switch-type phase shifter 2 is operated in the first frequency band B1 (27-29 GHz). When Vt=2 and Vs=0, the switch-type phase shifter 2 is operated in the second frequency band B2 (38-40 GHz). As shown in FIG. 11B, the loss variation the switch-type phase shifter 2 is less than 1 dB in both the first frequency band B1 (27-29 GHz) and the second frequency band B2 (38-40 GHz).

FIG. 11C shows the relative phase, in different frequency bands, of the switch-type phase shifter 2 when the phase delay of the switch-type phase shifter 2 is 45°. The horizontal axis stands for frequency and the vertical axis stands for relative phase. When Vt=0 and Vs=2, the switch-type phase shifter 2 is operated in the first frequency band B1 (27-29 GHz). When Vt=2 and Vs=0, the switch-type phase shifter 2 is operated in the second frequency band B2 (38-40 GHz). As shown in FIG. 11C, the relative phase of the switch-type phase shifter 2 is very close to 450 in both the first frequency band B1 (27-29 GHz) and the second frequency band B2 (38-40 GHz), so the phase error of the switch-type phase shifter 2 can be significantly reduced. As described above, the switch-type phase shifter 2 can surely achieve great characteristics.

It is worthy to point out that currently available phase shifters cannot achieve good characteristics in several frequency bands because of the limited bandwidths thereof. On the contrary, according to one embodiment of the disclosure, the half circuits H1, H2 of the phase shifting units 11 of the switch-type phase shifter 1 can realize the phase delay by the low-pass 7t-type circuit structure including the variable capacitors Vc1, Vc2 and the variable inductor VL. Besides, the characteristics and the phase delay of each of the phase shifting unit 11 can be changed by adjusting the variable capacitors Vc1, Vc2 and the variable inductor VL. Therefore, the characteristics of the phase shifting unit 11 can satisfy the requirements of several frequency bands and the desired phase delay can be achieved, so the switch-type phase shifter 1 can have great characteristics in the several frequency bands.

Besides, according to one embodiment of the disclosure, the half circuits H1, H2 of the phase shifting units 21 of the switch-type phase shifter 2 adopt the variable inductor VL including the wire wound inductor Lw, the third transistor T3 and the metal grid structure G. The variable inductor VL can realize great inductance adjustment mechanism, so can effectively improve the characteristics of the switch-type phase shifter 2.

Moreover, according to one embodiment of the disclosure, each of the half circuits H1, H2 of the phase shifting units 21 of the switch-type phase shifter 2 includes the inductors L coupled to the input node Ni and the output node No thereof, which allows the phase shifting unit 21 can achieve proper impedance matching.

Furthermore, according to one embodiment of the disclosure, the circuit design of the switch-type phase shifter 2 is simple and can achieve the desired technical effects, so the switch-type phase shifter 2 can satisfy the requirements of 5G without significantly increasing cost and achieve high commercial value.

Figure 12:
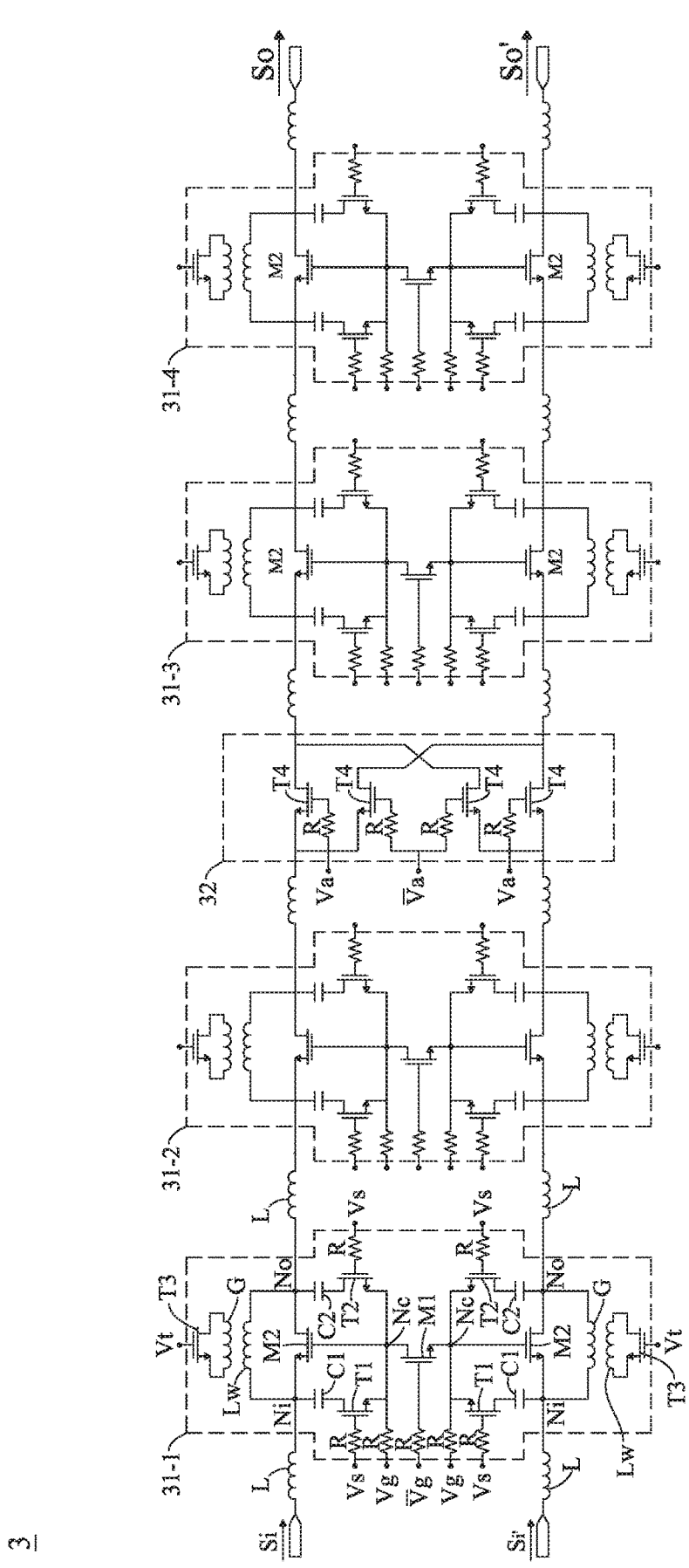
FIG. 12 is a circuit diagram of phase shifting units of a 5-bit switch-type phase shifter of a third embodiment in accordance with the disclosure.

FIG. 12 is a circuit diagram of phase shifting units of a 5-bit switch-type phase shifter of a third embodiment in accordance with the disclosure. As shown in FIG. 12, the switch-type phase shifter 3 is a 5-bit phase shifter, which includes a plurality of phase shifting units 31-1, 31-2, 31-3, 31-4, 32. The phase shifting units 31-1, 31-2, 31-3, 31-4 adopt the circuit structure of the second embodiment and the phase delays of these phase shifting units 31-1, 31-2, 31-3, 31-4 are 11.25°, 45°, 90°, 25.5° respectively. The phase shifting unit 32 is a common 180° phase shifting circuit, which includes a plurality of transistors T4 and resistors R.

Figure 13B:
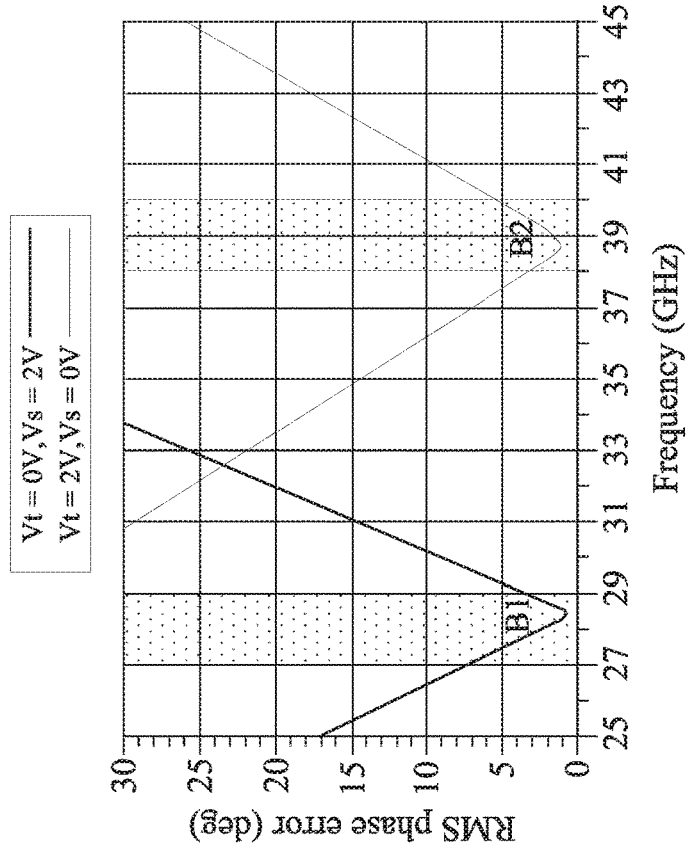
FIG. 13B is a simulation result diagram of RMS phase error of the switch-type phase shifter of the third embodiment in accordance with the disclosure.
Figure 13A:
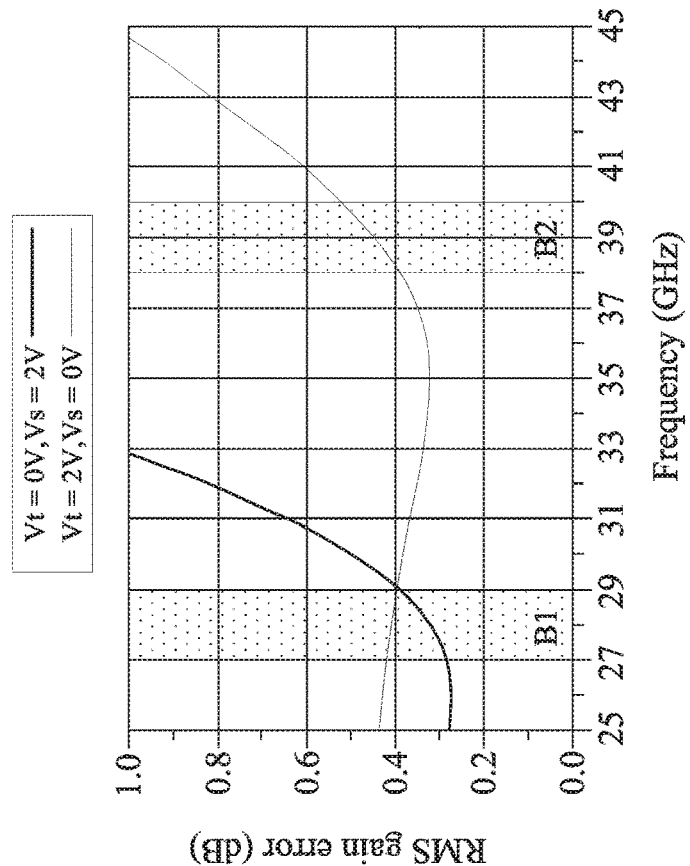
FIG. 13A is a simulation result diagram of RMS gain error of the switch-type phase shifter of the third embodiment in accordance with the disclosure.

FIG. 13A and FIG. 13B are simulation result diagrams of RMS gain error and RMS phase error of the switch-type phase shifter of the third embodiment in accordance with the disclosure respectively.

As shown in FIG. 13A, the curved line on the left stands for the RMS gain error of the switch-type phase shifter 3 in different frequency bands when the inductor control signal Vt is low level and the capacitor control signal Vs is high level. The curved line on the right stands for the RMS gain error of the switch-type phase shifter 3 in different frequency bands when the inductor control signal Vt is high level and the capacitor control signal Vs is low level. As shown in FIG. 13A, the RMS gain error of the switch-type phase shifter 3 can be obviously reduced in both the first frequency band B1 (27-29 GHz) and the second frequency band B2 (38-40 GHz).

As shown in FIG. 13B, the curved line on the left stands for the RMS phase error of the switch-type phase shifter 3 in different frequency bands when the inductor control signal Vt is low level and the capacitor control signal Vs is high level. The curved line on the right stands for the RMS phase error of the switch-type phase shifter 3 in different frequency bands when the inductor control signal Vt is high level and the capacitor control signal Vs is low level. As shown in FIG. 13B, the RMS phase error of the switch-type phase shifter 3 can also be obviously reduced in both the first frequency band B1 (27-29 GHz) and the second frequency band B2 (38-40 GHz).

Figure 13D:
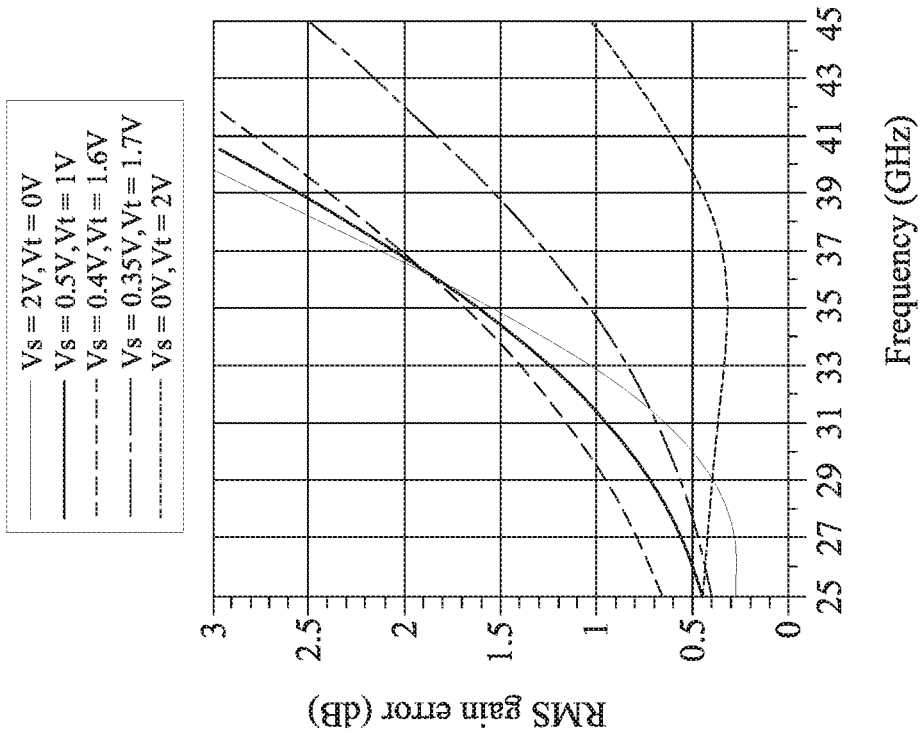
FIG. 13D is a simulation result diagram of RMS gain error of the switch-type phase shifter of the third embodiment in accordance with the disclosure.
Figure 13C:
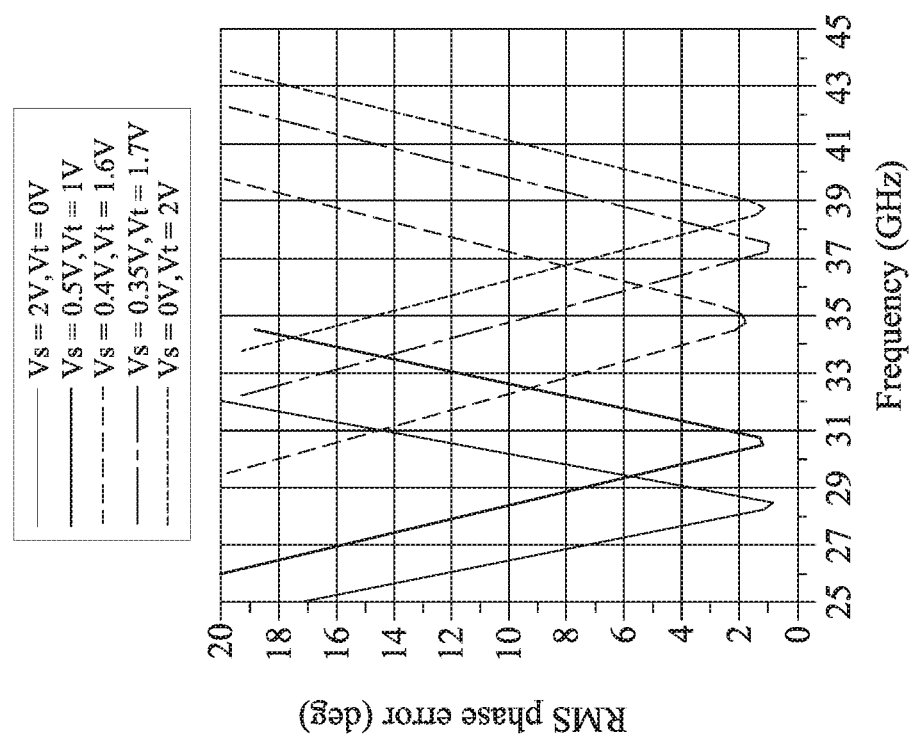
FIG. 13C is a simulation result diagram of RMS phase error of the switch-type phase shifter of the third embodiment in accordance with the disclosure.

FIG. 13C and FIG. 13D are simulation result diagrams of RMS phase error and RMS gain error of the switch-type phase shifter of the third embodiment in accordance with the disclosure respectively.

As shown in FIG. 13C, each of the curved lines stands for the RMS phase errors of 32 phase statuses of the 5-bit switch-type phase shifter 3 in different frequency bands when the inductor control signal Vt and the capacitor control signal Vs are constant. For example, the curved line on the far left stands for the RMS phase error of 32 phase statuses of the 5-bit switch-type phase shifter 3 in different frequency bands when the inductor control signal Vt is 0V and the capacitor control signal Vs is 2V.

As shown in FIG. 13D, each of the curved lines stand for the RMS gain errors of 32 phase statuses of the 5-bit switch-type phase shifter 3 in different frequency bands when the inductor control signal Vt and the capacitor control signal Vs are constant. For example, the curved line on the far left stands for the RMS gain error of 32 phase statuses of the 5-bit switch-type phase shifter 3 in different frequency bands when the inductor control signal Vt is 0V and the capacitor control signal Vs is 2V.

According to FIG. 13C and FIG. 13D, the operating frequency of the switch-type phase shifter 3 can be adjusted within a range, such that the switch-type phase shifter 3 can achieve the same phase delay in different frequency bands and have excellent characteristics in many frequency bands.

The embodiment just exemplifies the disclosure and is not intended to limit the scope of the disclosure. Any equivalent modification and variation according to the spirit of the disclosure is to be also included within the scope of the following claims and their equivalents.

In summation of the description above, according to one embodiment of the disclosure, the half circuits H1, H2 of the phase shifting units 11 of the switch-type phase shifter 1 can realize the phase delay by the low-pass π-type circuit structure including the variable capacitors Vc1, Vc2 and the variable inductor VL. Besides, the characteristics and the phase delay of each of the phase shifting unit 11 can be changed by adjusting the variable capacitors Vc1, Vc2 and the variable inductor VL. Therefore, the characteristics of the phase shifting unit 11 can satisfy the requirements of several frequency bands and the desired phase delay can be achieved, so the switch-type phase shifter 1 can have great characteristics in the several frequency bands.

Besides, according to one embodiment of the disclosure, the half circuits H1, H2 of the phase shifting units 21 of the switch-type phase shifter 2 adopt the variable inductor VL including the wire wound inductor Lw, the third transistor T3 and the metal grid structure G. The variable inductor VL can realize great inductance adjustment mechanism, so can effectively improve the characteristics of the switch-type phase shifter 2.

Moreover, according to one embodiment of the disclosure, each of the half circuits H1, H2 of the phase shifting units 11 of the switch-type phase shifter 21 includes the inductors L coupled to the input node Ni and the output node No thereof, which allows the phase shifting unit 21 can achieve proper impedance matching.

Furthermore, according to one embodiment of the disclosure, the circuit design of the switch-type phase shifter 2 is simple and can achieve the desired technical effects, so the switch-type phase shifter 2 can satisfy the requirements of 5G without significantly increasing cost and achieve high commercial value.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A switch-type phase shifter, comprising at least one phase shifting unit, the phase shifting unit comprising two half circuits and a first switch connected to the half circuits and receiving a first control signal, and each of the half circuits comprising:
   a first variable capacitor having a first end coupled to an input node of the half circuit and a second end coupled to a control node of the half circuit;
   a second variable capacitor having a first end coupled to an output node of the half circuit and a second end coupled to the control node of the half circuit;
   a second switch having a first end coupled to the output node of the half circuit, a second end coupled to the input node of the half circuit, and a third end coupled to the control node of the half circuit and receiving a second control signal; and
   a variable inductor having a first end coupled to the input node of the half circuit and a second end coupled to the output end of the half circuit.

2. The switch-type phase shifter of claim 1, wherein an input signal of one of the half circuits and an input signal of the other one of the half circuits are equal in amplitude but opposite in phase.

3. The switch-type phase shifter of claim 1, wherein the first switch has a first end coupled to the control node of the one of the half circuits, a second end coupled to the control node of the other one of the half circuits, and a third end receiving the first control signal.

4. The switch-type phase shifter of claim 1, wherein the first switch is a transistor having a drain coupled to the control node of the one of the half circuits, a source coupled to the control node of the other one of the half circuits, and a gate receiving the first control signal.

5. The switch-type phase shifter of claim 1, wherein the first switch is a transistor having a source coupled to the control node of the one of the half circuits, a drain coupled to the control node of the other one of the half circuits, and a gate receiving the first control signal.

6. The switch-type phase shifter of claim 1, wherein the second switch is a transistor having a source coupled to the input node of the half circuit, a drain coupled to the output node of the half circuit, and a gate coupled to the control node of the half circuit.

7. The switch-type phase shifter of claim 1, wherein the second switch is a transistor having a drain coupled to the input node of the half circuit, a source coupled to the output node of the half circuit, and a gate coupled to the control node of the half circuit.

8. The switch-type phase shifter of claim 1, wherein the first variable capacitor comprises a first capacitor and a first transistor coupled to the first capacitor in series.

9. The switch-type phase shifter of claim 8, wherein the first capacitor has a first end coupled to the input node of the half circuit and a second end coupled to a drain of the first transistor, a source of the first transistor is coupled to the control node of the half circuit, and a gate of the first transistor receives a capacitor control signal.

10. The switch-type phase shifter of claim 1, wherein the first variable capacitor is a metal oxide semiconductor capacitor or a varactor diode.

11. The switch-type phase shifter of claim 1, wherein the second variable capacitor comprises a second capacitor and a second transistor coupled to the second capacitor in series.

12. The switch-type phase shifter of claim 11, wherein the second capacitor has a first end coupled to the output node of the half circuit and a second end coupled to a drain of the second transistor, a source of the second transistor is coupled to the control node of the half circuit, and a gate of the second transistor receives a capacitor control signal.

13. The switch-type phase shifter of claim 1, wherein the second variable capacitor is a metal oxide semiconductor capacitor or a varactor diode.

14. The switch-type phase shifter of claim 1, wherein the variable inductor comprises a metal grid structure, a transistor coupled to the metal grid structure and a wire wound inductor disposed on the metal grid structure, there is a space between the wire wound inductor and the metal grid structure, the wire wound inductor has a first end coupled to the input node of the half circuit and a second end coupled to the output node of the half circuit.

15. The switch-type phase shifter of claim 14, wherein the metal grid structure comprises a frame having an opening and a grid structure disposed in the frame, and the transistor has a source coupled to one end, adjacent to the opening, of the frame, a drain coupled to the other end, adjacent to the opening, of the frame, and a gate receiving an inductor control signal.

16. The switch-type phase shifter of claim 1, wherein the variable inductor is a path-switched type variable inductor, a transformer-type variable inductor or a MEMS (micro electro mechanical system)-type inductor.

17. The switch-type phase shifter of claim 1, wherein each of the half circuits further comprises two inductors coupled to the input node and the output node of the half circuit respectively.

\* \* \* \* \*